United States Patent [19]

Tomita et al.

[11] Patent Number: 4,880,977
[45] Date of Patent: Nov. 14, 1989

[54] ANALYTICAL ELECTRON MICROSCOPE

[75] Inventors: Ken Tomita; Seiichiro Mori, both of Tokyo, Japan

[73] Assignee: JEOL Ltd., Tokyo, Japan

[21] Appl. No.: 197,458

[22] Filed: May 23, 1988

[30] Foreign Application Priority Data

May 28, 1987 [JP] Japan ................... 62-133073

[51] Int. Cl.$^4$ ........................... H01J 37/26
[52] U.S. Cl. ..................... 205/311; 250/397
[58] Field of Search ............... 250/311, 307, 397

[56] References Cited

U.S. PATENT DOCUMENTS 2,267,137 12/1941 Ruska et al. ................... 250/397
2,443,107 6/1948 Hillier ........................... 250/307
3,795,809 3/1974 Takashima ..................... 250/311
3,919,550 11/1975 Banbury ........................ 250/311

OTHER PUBLICATIONS

"Nanometer Probe Electron Diffraction in Correspondence with Image Field", by T. Tomita and Y. Harada, in Proc. XIth International Congress on Electron Microscopy, Kyoto, 1986, pp. 727-728.

Primary Examiner—Jack I. Berman
Attorney, Agent, or Firm—Webb, Burden, Ziesenheim & Webb

[57] ABSTRACT

An analytical electron microscope directs an electron beam onto a specimen. The beam is switched back and forth between two states in one of which the beam is finely focused to a size on the order of nanometers. In the other the beam is defocused to a size on the order of microns. A magnified image of a relatively broad region on the specimen irradiated with the defocused beam and a bright spot image are alternately displayed on a fluorescent screen. The bright spot image is obtained from a region on the specimen irradiated with the focused beam. The two images are displayed alternately at intervals shorter than the persistence time of the fluorescent screen to permit one to observe both images simultaneously. The operator moves the position at which the beam irradiates the specimen to bring the bright spot image into a desired region to be analyzed while observing the two images. Thus, the focused beam irradiates the specimen at the desired region. The resulting X-rays are detected, or a diffraction image produced in response to the irradiation of the focused beam is photographed.

7 Claims, 4 Drawing Sheets

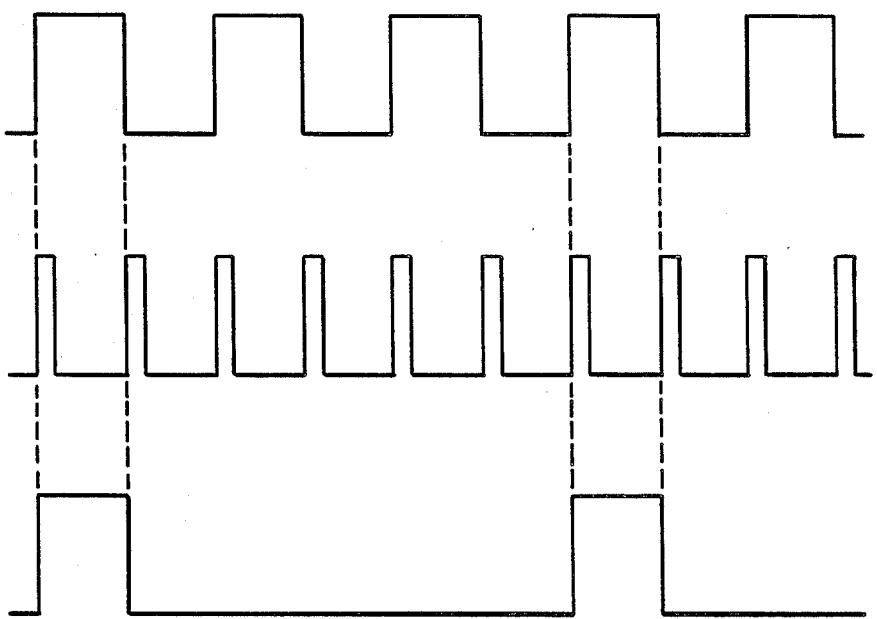
Fig. 2(a)
Fig. 2(b)
Fig. 2(c)
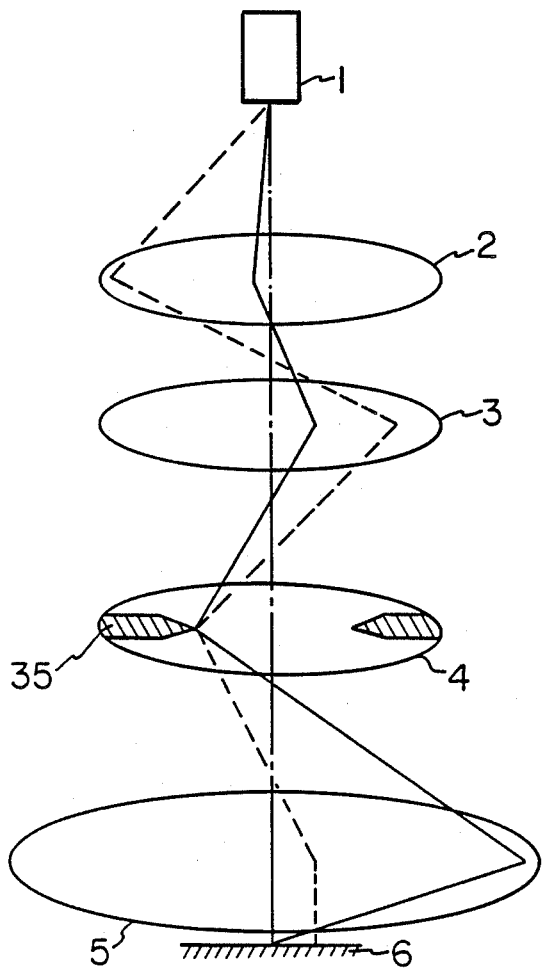
Fig. 3(a)
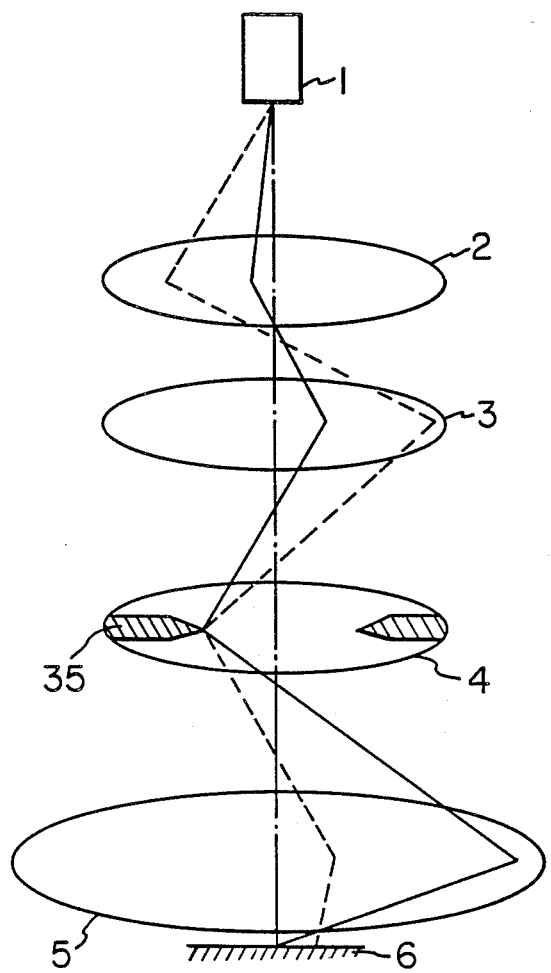
Fig. 3(b)

ANALYTICAL ELECTRON MICROSCOPE

FIELD OF THE INVENTION

The present invention relates to an analytical electron microscope and, more particularly, to an analytical region on the specimen to be analyzed by irradiating the focused electron beam.

BACKGROUND OF THE INVENTION

In the field of materials science, elemental and structural analysis are widely carried out using an analytical electron microscope. When such an analysis is made with the microscope, a defocused electron beam of a relatively large diameter on the order of microns is first directed to a specimen to obtain a high-resolution transmission electron image at a high magnification, say of approximately one million. Then, the operator selects a microscopic region to be analyzed, such as a grain boundary, while observing the image. Subsequently, the beam is sharply focused to a diameter of the order of nanometers and is caused to irradiate the selected region. An electron diffraction pattern is then derived from this region. Also, x-rays produced from the irradiated region are detected by an x-ray detector. The output signal from the detector is fed to an energy-dispersive x-ray spectrometer to analyze the x-rays. This instrument is disclosed in an article entitled "Nanometer Probe Electron Diffraction in Correspondence with Image Field" by T. Tomita and Y. Harada, in Proc. XIth International Congress on Electron Microscopy, Kyoto, 1986, pp. 727–728.

This analytical electron microscope has two separate modes of operation. In particular, in one mode the defocused electron beam of the diameter on the order of microns is used to irradiate the specimen for observing an image. In the other mode the finely focused beam of the diameter on the order of nanometers is caused to irradiate on the specimen to analyze it. Therefore, it is difficult to accurately irradiate the electron beam on the desired microscopic region by observing the image. If the specimen is so moved that the desired region is placed on the optical axis, then it is possible to irradiate the electron beam on the desired region. However, since the electron beam and the specimen drift by the thermal fluctuation or the fluctuation of the external magnetic field etc., the positional relation between them changes. That is, if the focused electron beam irradiates on the specimen at a desired region at first, the irradiated region drifts with time.

SUMMARY OF THE INVENTION

It is an object of the invention to provide an analytical electron microscope which permits one to confirm the microscopic region or area to be analyzed, on which the focused electron beam is irradiated, within the transmission electron image.

It is another object of the invention to provide an analytical electron microscope which can keep irradiating a desired region precisely with a focused electron beam if the beam and the specimen drift.

The above objects are achieved in accordance with the teachings of the invention by an analytical electron microscope comprising: an electron gun for producing an electron beam; a condenser lens means for directing the electron beam onto a specimen; an imaging lens means for projecting an image of the specimen onto a fluorescent screen; and a control means which causes the focusing lens means to switch back and forth between a first operation mode, in which the focusing lens means finely focuses the beam impinging on the specimen, and a second operation mode in which the focusing lens means defocuses the beam impinging on the specimen.

BRIEF DESCRIPTION OF THE DRAWINGS

FIG. 2 is a diagram of waveforms produced in the microscope shown in FIG. 1;

FIGS. 3a and 3b are diagrams showing the paths of the electron beams directed to a specimen inside the microscope shown in FIG. 1;

DESCRIPTION OF THE PREFERRED EMBODIMENTS

Figure 1:
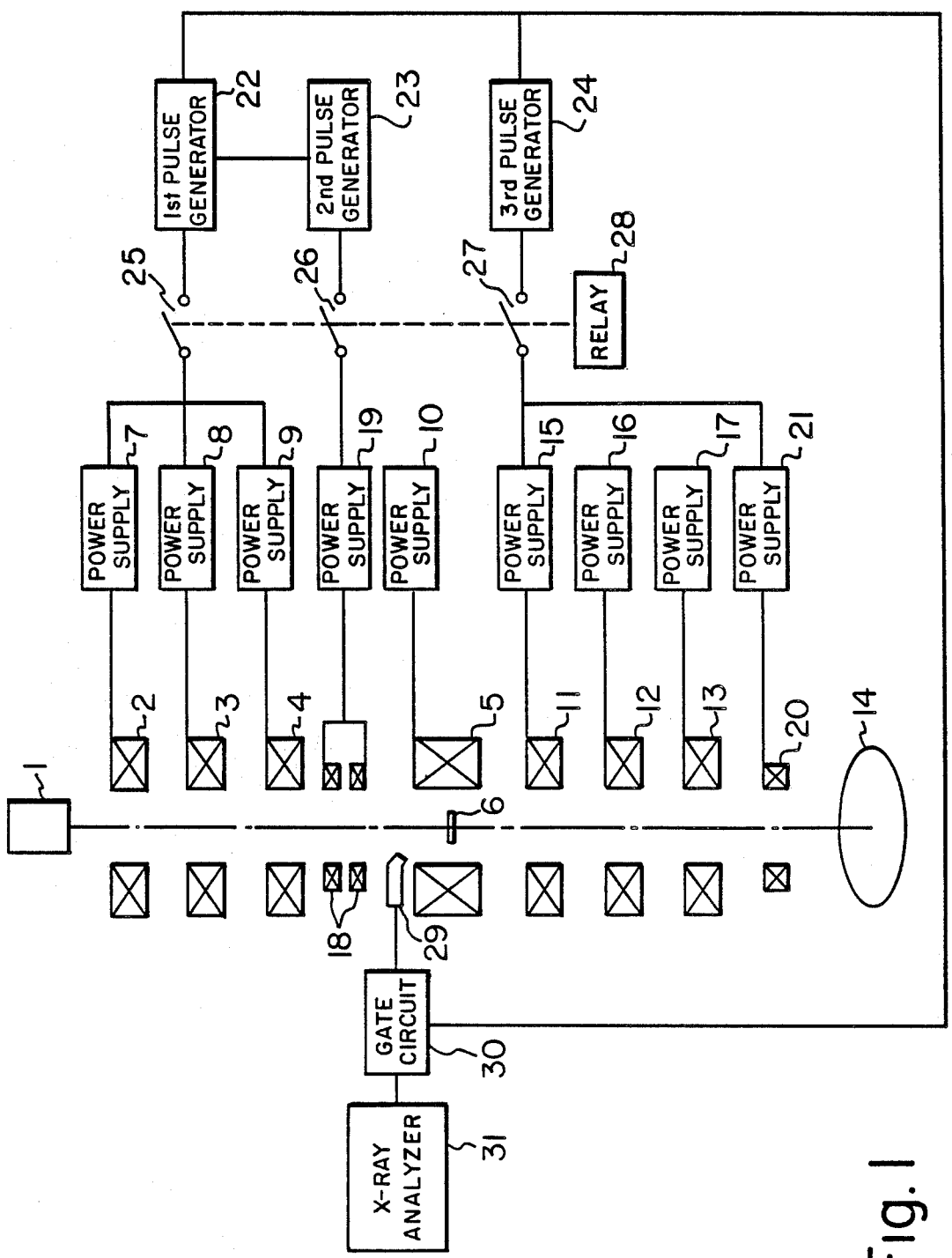
FIG. 1 is a block diagram of an analytical electron microscope according to the invention.

Referring to FIG. 1, an electron gun 1 produces an electron beam which is focused onto a specimen 6 by a first condenser lens 2, a second condenser lens 3, a third condenser lens 4, and an objective lens 5. The lenses 2, 3, 4, 5 are energized with currents from power supplies 7, 8, 9, 10, respectively. The electrons transmitted through the specimen are projected onto a fluorescent screen 14 by a first intermediate lens 11, a second intermediate lens 12, and a projector lens 13. The image formed on the screen 14, is observed with an optical microscope. Alternatively, radiation emanating from the screen 14 is guided to an image intensifier or the like. The video signal from the intensifier is fed to a cathode-ray tube to display the image. The lenses 11, 12, 13 are energized with currents from power supplies 15, 16, 17, respectively.

The position on the specimen 6, at which the electron beam irradiates, is varied by a deflection coil 18 which is energized with a current from a power supply 19. The beam falling on the fluorescent screen 14 is deflected by a deflection coil 20 that is energized with a current from a power supply 21. The output currents from the condenser lens power supplies 7, 8, 9 are changed according to pulses produced by a first pulse generator circuit 22. The deflection coil power supply 19 is controlled by pulses that are generated by a second pulse generator circuit 23 synchronized with the first pulse generator circuit 22. The first intermediate lens power supply 18 and the deflection coil power supply 21 are controlled by a third pulse generator circuit 24 synchronized with the first pulse generator circuit 22. A switch 25 is disposed between the condenser lens power supplies 7, 8 and 9 and the first pulse generator circuit 22. Another switch 26 is located between the deflection coil power supply 19 and the second pulse generator circuit 23. A switch 27 is provided between the third pulse generator circuit 24 and the junction of the intermediate lens power supply 15 and the deflection coil power supply 21. The switches 25, 26, 27 are closed or opened by means of a relay 28.

The irradiation of the focused electron beam to the specimen produces x-rays which are detected by an x-ray detector 29. The output signal from the detector 29 is fed to an analyzer 31 via a gate circuit 30 which receives pulses from the first pulse generator circuit 22.

In the operation of the electron microscope constructed as described above, the first pulse generator circuit 22 produces high-level and low-level pulses alternately at intervals of, for example, 1 to 100 msec, as shown in FIG. 2(a). The relay 28 is actuated to close the switches 25, 26, 27. Then, the pulses produced by the pulse generator circuit 22 are supplied to the condenser lens power supplies 7, 8, 9. The output currents from these power supplies 7–9 are controlled by their input pulses. The energizing currents supplied to the condenser lenses 7–9 are so controlled that when the input pulses are at high level, the beam falling on the specimen 6 is sharply focused to a size of the order of nanometers, and that when the input pulses are at low level, the beam irradiating the specimen is defocused to a size of the order of microns.

FIG. 3 shows the paths of the electron beams when the input pulses are at high level and low level. The paths indicated by the solid lines are obtained when high-level pulses are applied. At this time, the beam is focused sharply by the condenser lenses. The paths indicated by the broken lines occur when low-level pulses are applied. In this state, the beam is defocused and caused to fall on a relatively broad region on the specimen by the condenser lenses. In the example shown in FIG. 3(a), all the energizing currents supplied to the three condenser lenses are varied to direct the focused beam (solid line) and the defocused beam (dash line) alternately onto the specimen. In the example shown in FIG. 3(b), only the current supplied to the second condenser lens 3 is varied to direct the focused beam and the defocused beam alternately onto the specimen. Indicated by numeral 35 is a condenser lens aperture.

In this way, the focused and defocused electron beams are alternately directed onto the specimen at short intervals of about 1 to 100 msec. When the defocused beam irradiates the specimen, a magnified image of the irradiated region having a size on the order of microns is projected on the fluorescent screen 14. On the other hand, when the focused beam is directed onto the specimen, a quite narrow region of a size on the order of nanometers is irradiated. At this time, a bright spot appears on the fluorescent screen, the position on the fluorescent screen, on which bright spot appears, corresponding to the irradiated position on the specimen. These two kinds of images are alternately projected onto the screen 14. Since the intervals at which the beam is switched between the two states are shorter than the persistence time of the fluorescent screen, the operator can observe the two images simultaneously because of the afterglow of the screen. Specifically, the operator can see the bright spot within the relatively large transmission electron image.

The position at which the focused electron beam irradiates on the specimen can be varied by controlling the deflection coil power supply 19 so as to change the deflection current fed to the deflection coil 18. Thus, the deflection current is adjusted to move the irradiated position across the specimen. The operator observes a transmission electron image of a broad region of the specimen and brings the bright spot into a desired position. In this way, the focused electron beam can be caused to precisely irradiate the desired region to be analyzed. The x-rays produced by the irradiation of the focused beam are detected by the x-ray detector 29. The output signal from the detector 29 is furnished to the analyzer 31 via the gate circuit 30 which is supplied with pulses similar to the first pulses shown in FIG. 2(a). Only when the pulses are at high level, the gate circuit 30 is enabled. Therefore, only those x-rays which are produced when the focused beam impinges on the specimen are supplied to the analyzer, and the desired microscopic region of the specimen can be analyzed in terms of x-rays.

When the positional relation between the specimen and the electron beam changes because of drift, the change in the region to be analyzed can be immediately known, because the transmission electron image and the bright spot are always displayed on the fluorescent screen 14. The irradiated position can be brought back into the desired position by adjusting the current supplied to the deflection coil. In this case, the electron beam is deflected so that the focused beam may irradiate the specimen at the desired position. In another example, the specimen 6 is moved to cause the focused beam to fall on the desired region of the specimen.

Each condenser lens responds slowly to its input current which takes the form of pulses as shown in FIG. 2(a). That is, the magnetic field set up by the condenser lens changes more slowly than the input current. The second pulse generator circuit 23 produces pulses of a given duration on the leading edges and on the trailing edges of the pulses produced by the first pulse generator circuit 22, as shown in FIG. 2(b). When the pulse from the second pulse generator circuit 23 goes high, the deflection coil 18 deflects the beam off the fluorescent screen 14. The duration of the high state of the pulses corresponds to the time for which the magnitude of the magnetic field produced by the condenser lens is changed.

Figure 4:
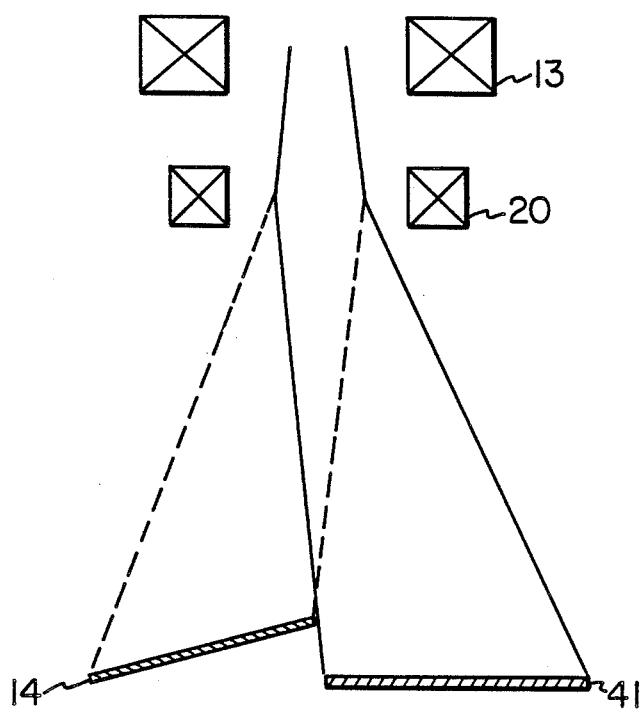
FIG. 4 is a diagram for illustrating the manner in which a transmission electron image is observed and a diffraction image is photographed.

FIG. 4 shows the manner in which a diffraction image is obtained. In this example, the fluorescent screen 14 and a photographic film 41 are juxtaposed under the projector lens 13. The electron beam is deflected either onto the screen 14 or onto the film 41 by the deflection coil 20 which is supplied with a deflection current from the power supply 21. Pulses shown in FIG. 2(c) are supplied to this power supply 21 from the third pulse generator circuit 24. The pulses shown in FIG. 2(c) are also supplied to the first intermediate lens power supply 11. When the pulses are at low level, the lens 11 and the deflection coil 20 are energized to project a transmission electron image onto the fluorescent screen 14. When the pulses are at high level, the intermediate lens 11 and the deflection coil 20 are energized to project a diffraction image onto the film 41. A state suitable for the photography of the diffraction image is reached whenever the specimen is irradiated with three successive pulses of the focused electron beam. Of course, this number of the pulses can be varied at will.

In the above example, the energizing currents supplied to the lenses are changed. Also, it is possible to provide an auxiliary lens and to vary the energizing current to the auxiliary lens while maintaining the energizing currents to the aforementioned lenses constant.

Figure 5:
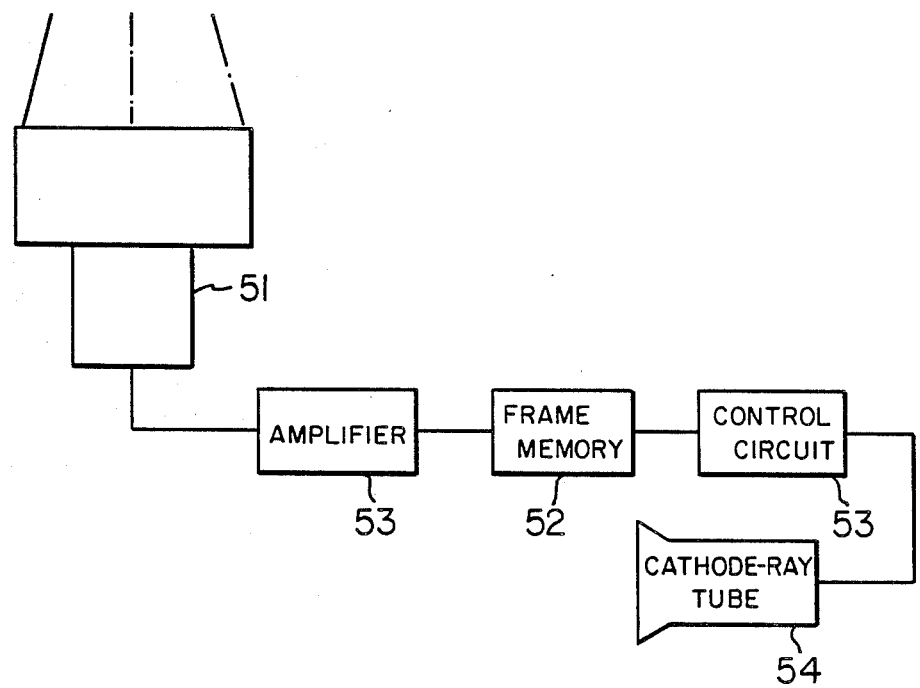
FIG. 5 is a block diagram of another embodiment of this invention where an image intensifier is used instead of a fluorescent screen.

FIG. 5 shows another embodiment of this invention, in which the image intensifier 51 is used instead of the fluorescent screen 14 in FIG. 1. The video signal from the intensifier 51 is fed to a frame memory 52 via an amplifier 53 and memorized on it. The two signals of transmission electron image and the bright spot are accumulated on the frame memory 52. The memorized signal on the frame memory is read by a control circuit 53 and fed to a cathode-ray tube 54. As a consequence, the operator can observe the transmission electron image and the bright spot simultaneously on the cathode-ray tube.

Figure 6:
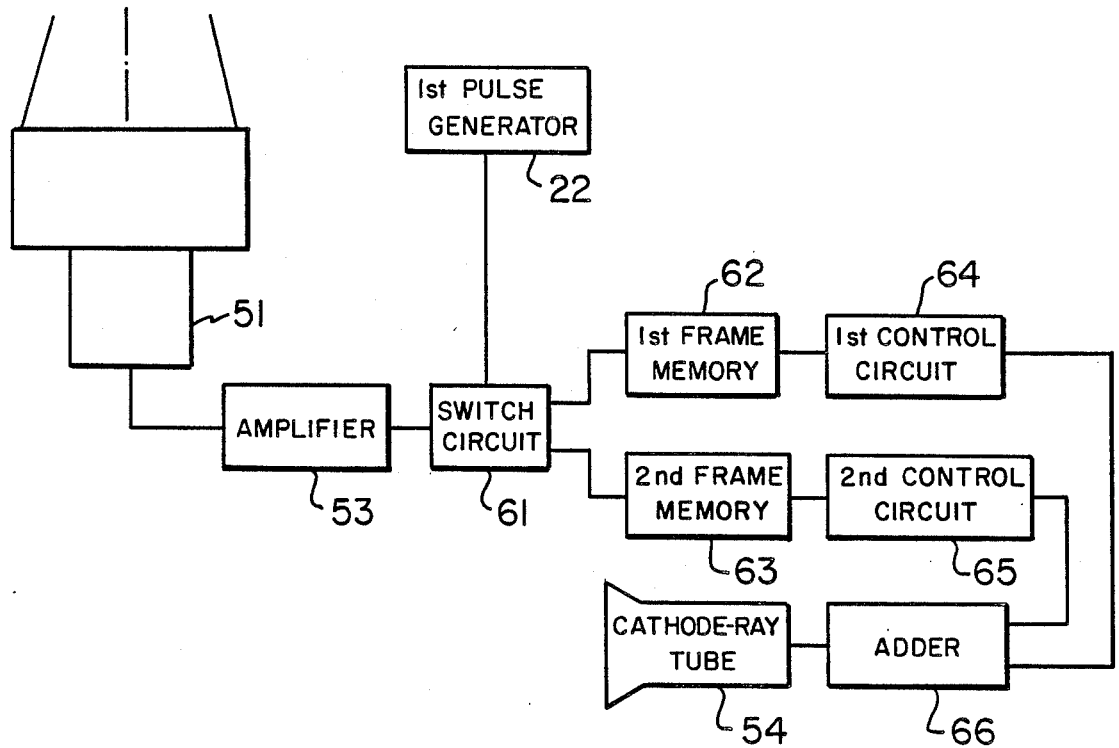
FIG. 6 shows another embodiment of the invention which utilizes switch circuit and is similar to the embodiment shown in FIG. 5.

FIG. 6 shows the improvement of the embodiment shown in FIG. 5. In the figure, the video signal from the intensifier 51 is fed to a switch circuit 61 to which the pulses are fed from the first pulse generator circuit 22. When the input pulses are at low level, the video signal is fed to a first frame memory 62 via the switch circuit 61 and memorized on it. On the other hand, when the input pulses are at high level, the video signal is fed to a second frame memory 63 and memorized on it. The memorized signals on the first and second frame memories 62 and 63 are read by a first and second control circuits 64 and 65, respectively. Then both signals are fed to an adder 66. The added signal from the adder 66 is fed to the cathode-ray tube 54 so that the operator can observe the transmission electron image and the bright spot showing the region to be analyzed simultaneously.

Having thus described our invention with the detail and particularity required by the Patent Laws, what is desired by Letters Patent is set forth in the following claims.

What is claimed is:

1. An analytical electron microscope comprising:
    an electron gun for producing an electron beam;
    a condenser lens means for directing the electron beam onto a specimen;
    an imaging lens means for projecting an image of the specimen onto a fluorescent screen; and
    a control means which causes the condenser lens means to switch back and forth between a first operation mode, in which the focusing lens means finely focuses the beam irradiating on the specimen such that a bright spot appears on the fluorescent screen, and a second operation mode in which the focusing lens means defocuses the beam irradiating on the specimen such that a transmission electron microscope image appears on the fluorescent screen, the electron beam being switched between the two states at intervals shorter than the persistance time of the fluorescent screen whereby the location of the finely focussed beam appears as a bright spot upon the transmission electron microscope image enabling the positioning of the finely focussed beam upon a feature of the specimen represented by the image.

2. The analytical electron microscope of claim 1, wherein the electron beam is deflected off the specimen for a given period immediately after the energizing current fed to the focusing lens means is varied.

3. An analytical electron microscope comprising:
    an electron gun for producing an electron beam;
    a condenser lens means for directing the electron beam onto a specimen;
    an imaging lens means for projecting an image of the specimen onto a fluorescent screen;
    a control means which causes the condenser lens means to switch back and forth between a first operation mode, in which the focusing lens means finely focuses the beam irradiating on the specimen such that a bright spot appears on the fluorescent screen, and a second operation mode in which the focusing lens means defocuses the beam irradiating on the specimen such that a transmission electron microscope image appears on the fluorescent screen, the electron beaming being switched between the two states at intervals shorter than the persistance time of the fluorescent screen whereby the location of the finely focussed beam appears as a bright spot upon the transmission electron microscope image enabling the positioning of the finely focussed beam upon a feature of the specimen represented by the image;
    an x-ray detector for detecting the x-rays produced in response to the irradiation of the electron beam when finely focussed to the specimen; and
    a means for supplying the output signal from the x-ray detector to an x-ray analyzer only when the specimen is being irradiated with the focused electron beam.

4. The analytical electron microscope of claim 3, wherein the electron beam is deflected off the specimen for a given period immediately after the energizing current fed to the focusing leans means is varied.

5. An analytical electron microscope comprising:
    an electron gun for emanating an electron beam;
    a condenser lens means for directing the electron beam onto a specimen;
    an image intensifier for producing a video signal of the image;
    memory means for memorizing the video signal;
    display means for displaying the image based on the memorized signal; and
    a control means which causes the condenser lens means to switch back and forth between a first operation mode, in which the focusing lens means finely focused the beam irradiating on the specimen such that a bright spot is memorized, ad a second operation mode in which the focusing lens means defocuses the beam irradiating on the specimen such that a transmission electron microscope image is memorized whereby the location of the finely focussed beam appears as a bright spot upon the transmission electron microscope image enabling the positioning of the finely focussed beam upon a feature of the specimen represented by the image.

6. An analytical electron microscope of claim 5, wherein the memory means accumulates the video signal obtained when the defocused electron beam is irradiated and the video signal when the focused electron beam is irradiated.

7. An analytical electron microscope of claim 6, wherein the memory means comprises two frame memories, the one memorizing the video signal which is obtained when the defocused electron beam is irradiated, the other memorizing the video signal which is obtained when the focused electron beam is irradiated, the video signals memorized on the both frame memories being added by an adder, the added signal being fed to a cathode-ray tube.

* * * * *

UNITED STATES PATENT AND TRADEMARK OFFICE
CERTIFICATE OF CORRECTION

PATENT NO. : 4,880,977

DATED : November 14, 1989

INVENTOR(S) : Ken Tomita and Seiichiro Mori

It is certified that error appears in the above-identified patent and that said Letters Patent is hereby corrected as shown below:

Claim 4 Line 26 Column 6 "leans" should read --lens--.

Claim 5 Line 41 Column 6 "ad" should read --and--.

Signed and Sealed this

Ninth Day of October, 1990

Attest:

HARRY F. MANBECK, JR.

*Attesting Officer*     *Commissioner of Patents and Trademarks*